(12) United States Patent
Chen et al.

(10) Patent No.: US 10,854,533 B2
(45) Date of Patent: Dec. 1, 2020

(54) SEMICONDUCTOR PACKAGE AND METHOD FOR MANUFACTURING THE SAME

(71) Applicant: Advanced Semiconductor Engineering, Inc., Kaohsiung (TW)

(72) Inventors: Chung Hao Chen, Kaohsiung (TW); Chin-Cheng Kuo, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 16/277,826

(22) Filed: Feb. 15, 2019

(65) Prior Publication Data

US 2019/0295926 A1 Sep. 26, 2019

Related U.S. Application Data

(60) Provisional application No. 62/648,100, filed on Mar. 26, 2018.

(51) Int. Cl.
| | | |
|---|---|---|
| *H01L 23/48* | (2006.01) | |
| *H01L 21/768* | (2006.01) | |
| *H01L 21/56* | (2006.01) | |
| *H01L 23/31* | (2006.01) | |
| *H01L 23/00* | (2006.01) | |
| *B81B 7/00* | (2006.01) | |
| *B81B 7/02* | (2006.01) | |

(52) U.S. Cl.
CPC .......... *H01L 23/481* (2013.01); *B81B 7/0032* (2013.01); *B81B 7/02* (2013.01); *H01L 21/56* (2013.01); *H01L 21/76898* (2013.01); *H01L 23/3128* (2013.01); *H01L 24/09* (2013.01); *H01L 24/17* (2013.01); *B81B 2207/07* (2013.01); *B81B 2207/093* (2013.01); *B81B 2207/096* (2013.01)

(58) Field of Classification Search
CPC .............................. B81B 7/02; B81C 1/00301
USPC ........................................................ 257/690
See application file for complete search history.

(56) References Cited

U.S. PATENT DOCUMENTS

2013/0127879 A1* 5/2013 Burns ................... G01L 9/0051
345/501
2017/0141058 A1 5/2017 Lee et al.

* cited by examiner

*Primary Examiner* — Walter H Swanson
(74) *Attorney, Agent, or Firm* — Foley & Lardner LLP

(57) ABSTRACT

A semiconductor package may include a substrate; a microelectromechanical device disposed on the substrate; an interconnection structure connecting the substrate to the microelectromechanical device; and a metallic sealing structure surrounding the interconnection structure.

19 Claims, 13 Drawing Sheets

SEMICONDUCTOR PACKAGE AND METHOD FOR MANUFACTURING THE SAME

CROSS REFERENCE TO RELATED APPLICATION

This application claims the benefit of and priority to U.S. Provisional Application No. 62/648,100, filed Mar. 26, 2018, the contents of which are incorporated herein by reference in their entirety.

BACKGROUND

1. Technical Field

The present disclosure relates to a semiconductor package and a method for manufacturing the same, and to a semiconductor package including a substrate and microelectromechanical device.

2. Description of the Related Art

In a comparative process for manufacturing a package integrated with a microelectromechanical device, specific materials, such as $LiNbO_3$ or $LiTaO_3$, may be used. However, it can be difficult to integrate a package formed of $LiNbO_3$ or $LiTaO_3$ with other silicon-based packages, which can lead to problems related to structural strength and reliability of the package. In addition, a metal connection structure of certain comparative packages that connects the microelectromechanical device with a substrate may be exposed to an environment, which can cause the metal connection structure to be oxidized or polluted.

SUMMARY

In accordance with some embodiments of the present disclosure, a semiconductor package may include a substrate, a microelectromechanical device disposed on the substrate, an interconnection structure connecting the substrate to the microelectromechanical device, and a metallic sealing structure surrounding the interconnection structure.

In accordance with some embodiments of the present disclosure, a semiconductor package includes a substrate having a first surface and a second surface opposite to the first surface, defining an opening, and comprising a conductive post disposed in the opening, a microelectromechanical device disposed on the substrate, an interconnection structure disposed between the substrate and the microelectromechanical device, and a sealing structure disposed between the substrate and the microelectromechanical device. The semiconductor package further includes a first conductive pattern disposed on the first surface of the substrate and facing toward the microelectromechanical device, and a second conductive pattern disposed on the second surface of the substrate. The first conductive pattern is electrically connected to the second conductive pattern through the conductive post, and the interconnection structure is surrounded by the sealing structure.

In accordance with some embodiments of the present disclosure, a method for manufacturing a semiconductor package includes providing a substrate, providing a microelectromechanical device, and forming an interconnection structure and a sealing structure between the substrate and the microelectromechanical device.

BRIEF DESCRIPTION OF THE DRAWINGS

Aspects of the present disclosure are best understood from the following detailed description when read with the accompanying drawings. It is noted that various features may not be drawn to scale, and the dimensions of the various features may be arbitrarily increased or reduced for clarity of discussion.

Figure 1:
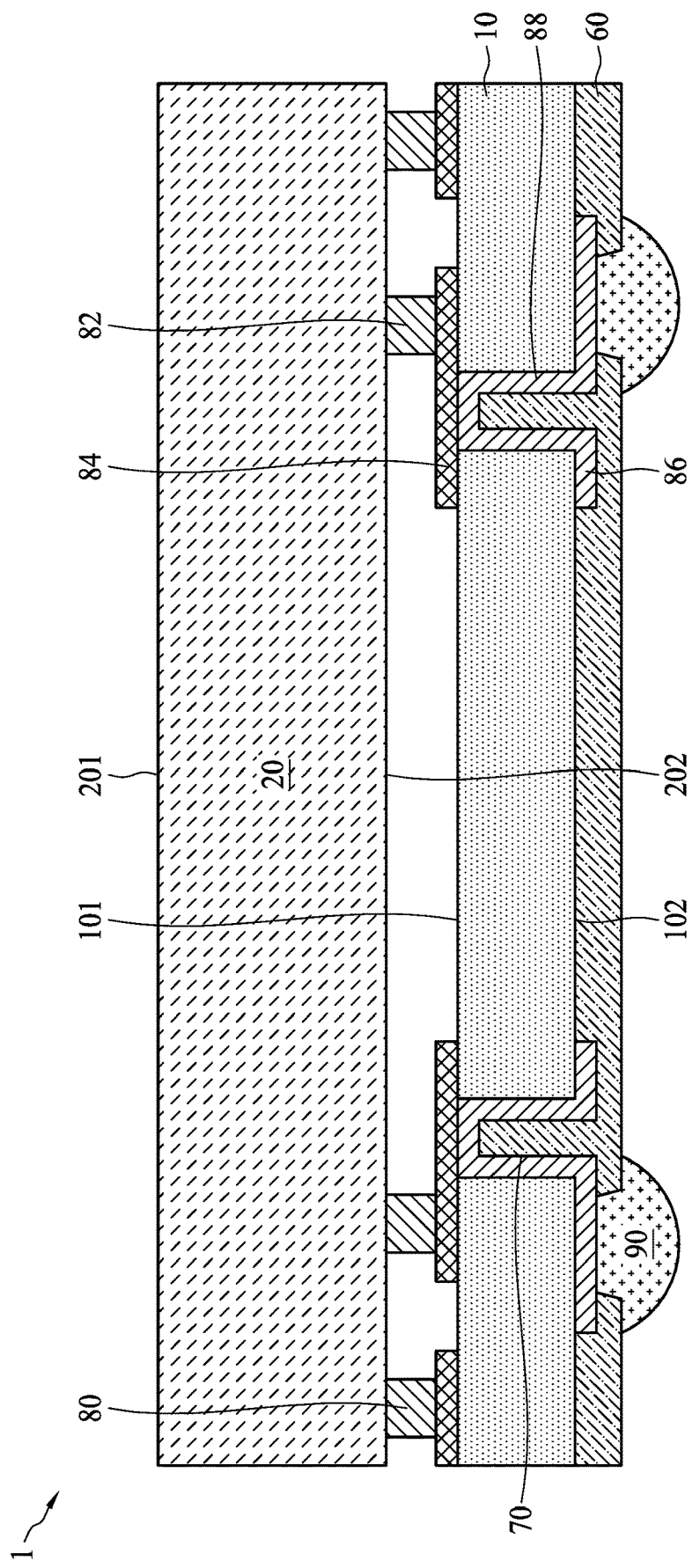
FIG. 1 illustrates a semiconductor package in accordance with some embodiments of the present disclosure.

Common reference numerals are used throughout the drawings and the detailed description to indicate the same or similar components. The present disclosure will be readily understood from the following detailed description taken in conjunction with the accompanying drawings.

DETAILED DESCRIPTION

Various embodiments of the present disclosure are discussed in detail below. It should be appreciated, however, that the embodiments set forth many applicable concepts that can be embodied in a wide variety of specific contexts. It is to be understood that the following disclosure provides for many different embodiments or examples of implementing different features of various embodiments. Specific examples of components and arrangements are described below for purposes of discussion. These are, of course, merely examples and are not intended to be limiting.

Embodiments, or examples, illustrated in the drawings are disclosed below using specific language. It will nevertheless be understood that the embodiments and examples are not intended to be limiting. Any alterations and modifications of the disclosed embodiments, and any further applications of the principles disclosed in this document, as would normally occur to one of ordinary skill in the pertinent art, fall within the scope of this disclosure.

In addition, the present disclosure may repeat reference numerals and/or letters in the various examples. This repetition is for the purpose of simplicity and clarity and does not in itself dictate a relationship between the various embodiments and/or configurations discussed.

According to at least some embodiments of the present disclosure, a substrate is connected to a microelectromechanical device through a metallic sealing structure and an interconnection structure. The interconnection structure surrounded by the metallic sealing structure may provide for a greater structure strength, improved stress management, and reliability for the package. The metallic sealing structure may provide for an improved hermetic sealing. Oxidization of the interconnection structure electrically connected to the conductive post may be avoided or mitigated since an environmental humidity may be blocked, at least in part, by the metallic sealing structure. The interconnection structure electrically connected to a conductive post may shorten a signal transmission path and reduce a signal loss. First and second sealing structures including a plurality of trenches filled with bonding elements may be implemented, and may help to avoid solder bleeding out (e.g., during manufacture).

FIG. 1 illustrates a semiconductor package 1 in accordance with some embodiments of the present disclosure. The semiconductor package 1 includes a substrate 10, a microelectromechanical device 20, one or more interconnection structures 82 and a sealing structure 80.

The substrate 10 has a surface 101 and a surface 102 opposite to the surface 101. The surface 101 of the substrate faces the microelectromechanical device 20. In one or more embodiments, the substrate 10 includes a material such as a glass, silicon or other suitable materials. A protection layer (e.g., a passivation layer or a photoresist layer) 60 is disposed on the surface 102 of the substrate 10. In one or more embodiments, the protection layer 60 includes a polyimide (PI), a polymer (e.g., polypropylene (PP)), a resin or other suitable materials. A conductive bump 90 is disposed on the protection layer 60. In some embodiments, the conductive bump 90 may be a solder ball.

In some embodiments, the substrate 10 includes an interconnection structure (e.g., conductive post) 88 penetrating the substrate 10 to provide electrical connection between the surface 101 and the surface 102 of the substrate 10. In some embodiments, the interconnection structure 88 is a through silicon via (TSV) and the substrate 10 includes a silicon material. In some embodiments, the interconnection structure 88 is a through glass via (TGV) and the substrate 10 includes a glass material. The interconnection structure 88 may include copper (Cu) or other suitable metals or alloys. In some embodiments, a portion of the protection layer 60 extends into an opening 70 defined by the interconnection structure 88.

The substrate 10 may include a conductive pattern (or conductive pads) 84 disposed on the surface 101 of the substrate 10 and a conductive pattern (or conductive pads) 86 disposed on the surface 102 of the substrate 10. The conductive pattern 84 is electrically connected to the conductive pattern 86 through the interconnection structure 88. The conductive pattern 84 contacts the interconnection structures 82 and is electrically connected to the interconnection structures 82. In some embodiments, the conductive patterns 84 and 86 include copper or other suitable metals or alloys.

The microelectromechanical device 20 is disposed on the surface 101 of the substrate 10 and electrically connected to the substrate 10. The microelectromechanical device 20 is electrically connected to the conductive pattern 84 of the substrate 10 through the interconnection structures 82. The microelectromechanical device 20 may include a surface acoustic wave (SAW) filter or other semiconductor chips (e.g., other electromechanical systems (MEMS)). In some embodiments, the microelectromechanical device 20 may include $LiNbO_3$ or $LiTaO_3$. The microelectromechanical device 20 has a first surface 201 facing away from the substrate 10, and a second surface 202 opposite to the first surface 201 facing towards the substrate 10.

The interconnection structures 82 are disposed between the microelectromechanical device 20 and the substrate 10. The interconnection structures 82 are electrically connected to the active surface of the microelectromechanical device 20 and the conductive pattern 84 on the surface 101 of the substrate 10. The interconnection structures 82 may include copper or other suitable metals or alloys.

The sealing structure 80 is disposed between the microelectromechanical device 20 and the substrate 10. The sealing structure 80 surrounds the interconnection structures 82. The sealing structure 80 may include copper or other suitable metals or alloys. In some embodiments, the sealing structure 80 may include a material similar to or the same as the material of the interconnection structures 82 (e.g., copper). In some embodiments, the sealing structure 80 and the interconnection structures 82 may include different materials.

In some comparative semiconductor packages with a microelectromechanical device, a sealing structure is formed of a polymer, and the microelectromechanical device is connected to a substrate through a metal layer disposed on sidewalls of the substrate. However, the sealing or support capability of the polymer is relatively weak, which can reduce the reliability of the semiconductor package. In addition, since the metal layer is disposed along the sidewalls of the substrate, the path for transmitting signal is relatively long, which may negatively affect the signal transmission between the microelectromechanical device and the substrate. In addition, since the metal layer is exposed to the environment, it can be readily oxidized or polluted.

In accordance with the embodiments as shown in FIG. 1, the sealing structure 80 includes metal, which can provide for an improved hermetic sealing, greater structural strength, stress management and reliability for the semiconductor package 1. In addition, the microelectromechanical device 20 is electrically connected to the substrate 10 through the interconnection structures 82 that are surrounded by the sealing structure 80, which can help to avoid the interconnection structures 82 being oxidized or polluted. Furthermore, the arrangement of the interconnection structures 82 shortens the signal transmission path between the microelectromechanical device 20 and the substrate 10, which can reduce signal loss and improve the performance of the semiconductor package 1.

Figure 2:
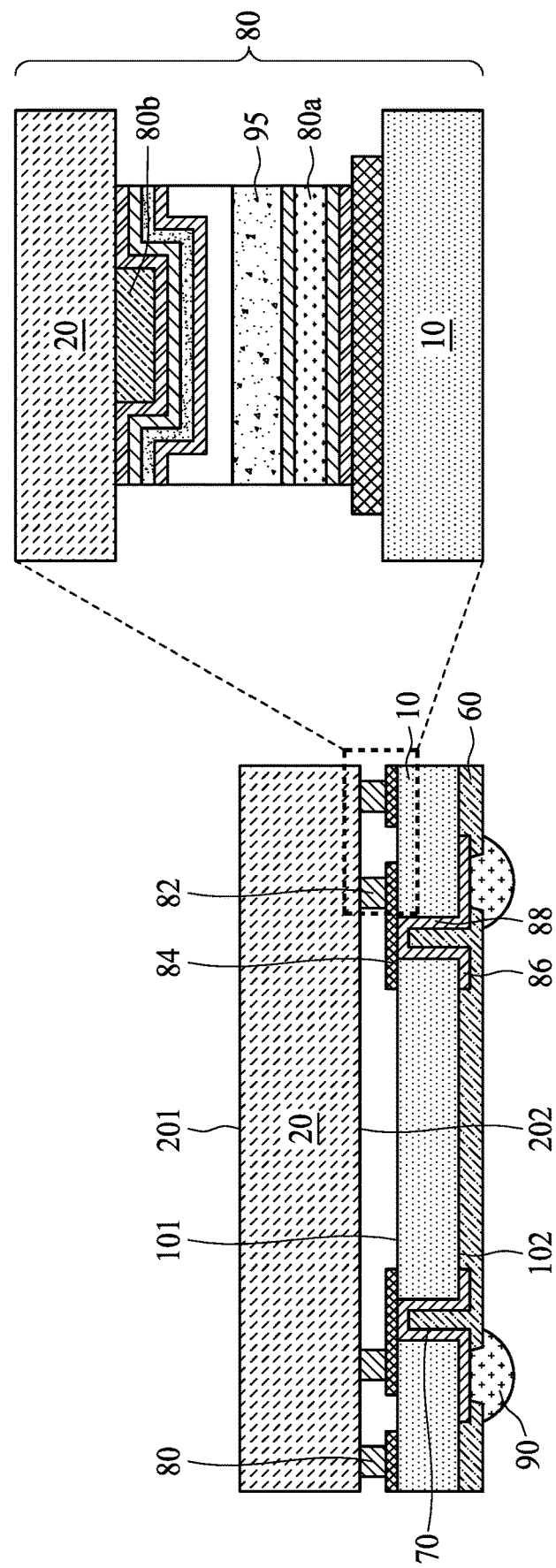
FIG. 2 illustrates a sectional view of a sealing structure of the semiconductor package of FIG. 1 in accordance with some embodiments of the present disclosure.

FIG. 2 illustrates a sectional view of the sealing structure 80 of the semiconductor package of FIG. 1 in accordance with some embodiments of the present disclosure. The sealing structure 80 includes sealing structures 80a and 80b (which may also be referred to as sub-sealing structures) and a bonding element 95. In some embodiments, the sealing structure 80a and sealing structure 80b include gold (Au), tin (Sn) or other suitable metals or alloys. The sealing structure 80a and sealing structure 80b may include a plurality of conductive layers. In some embodiments, the bonding element 95 includes tin or other suitable metals.

The sealing structure 80a is disposed on the surface 101 of the substrate 10 and faces toward the surface 202 of the microelectromechanical device 20. The sealing structure 80b is disposed on the surface 202 of the microelectromechanical device 20. The sealing structure 80a and the sealing structure 80b are connected to each other through the bonding element 95.

FIG. 3A to FIG. 3G illustrate a method of manufacturing a semiconductor package 1 in accordance with an embodiment of the present disclosure.

Figure 3A:
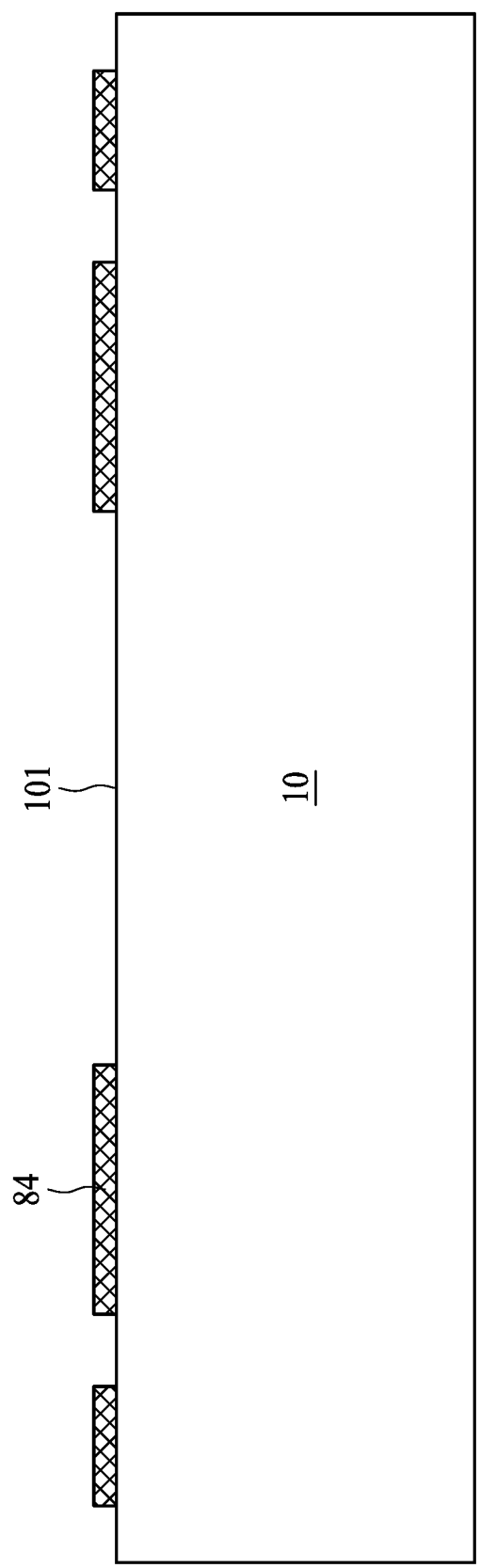
FIG. 3A, FIG. 3B, FIG. 3C, FIG. 3D, FIG. 3E, and FIG. 3F illustrate a method of manufacturing a semiconductor package in accordance with some embodiments of the present disclosure.

Referring to FIG. 3A, a substrate 10 is provided. In some embodiments, the substrate 10 includes a glass, silicon or other suitable materials. A conductive pattern 84 is disposed on a surface 101 of the substrate 10. In some embodiments, the conductive pattern 84 includes copper. In other embodiments, the conductive pattern 84 includes other suitable metals or alloys.

Figure 3B:
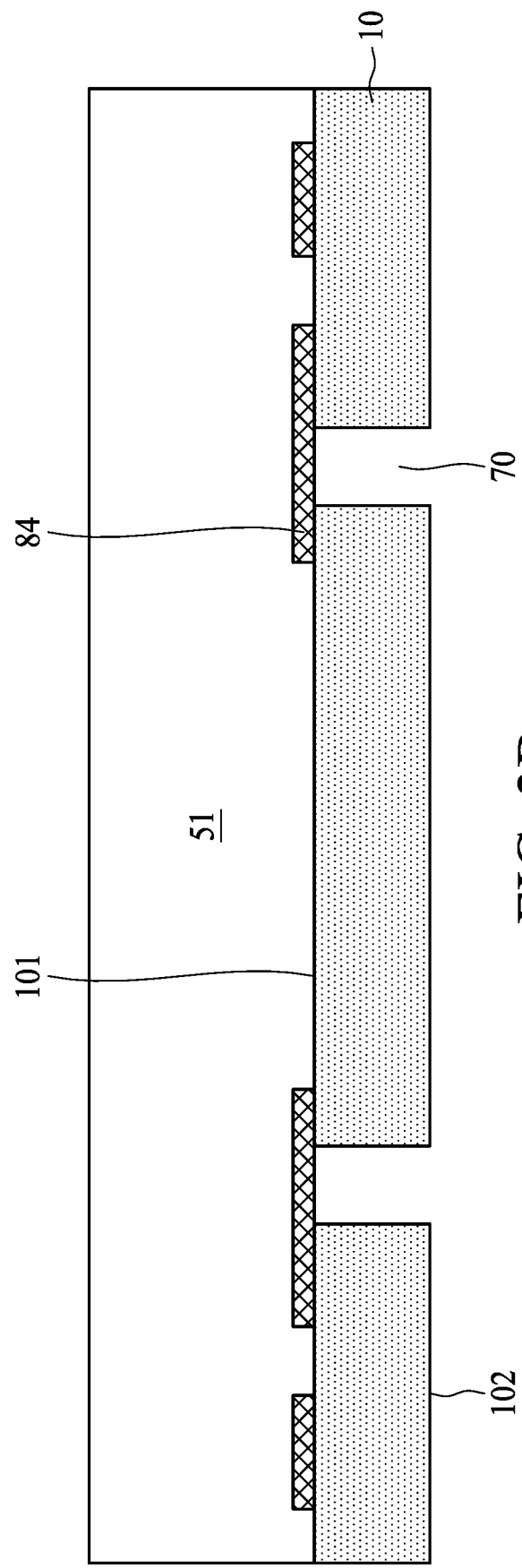

Referring to FIG. 3B, a carrier 51 is attached to the surface 101 of the substrate 10. Next, a thickness of the substrate 10 is reduced by using, for example, a grinding operation or other suitable operations. One or more openings 70 are formed to penetrating the substrate 10. In some embodiments, the openings 70 may be formed by performing an etching operation (such as deep reactive-ion etching (DRIE)) on a surface 102 of the substrate 10.

Figure 3C:
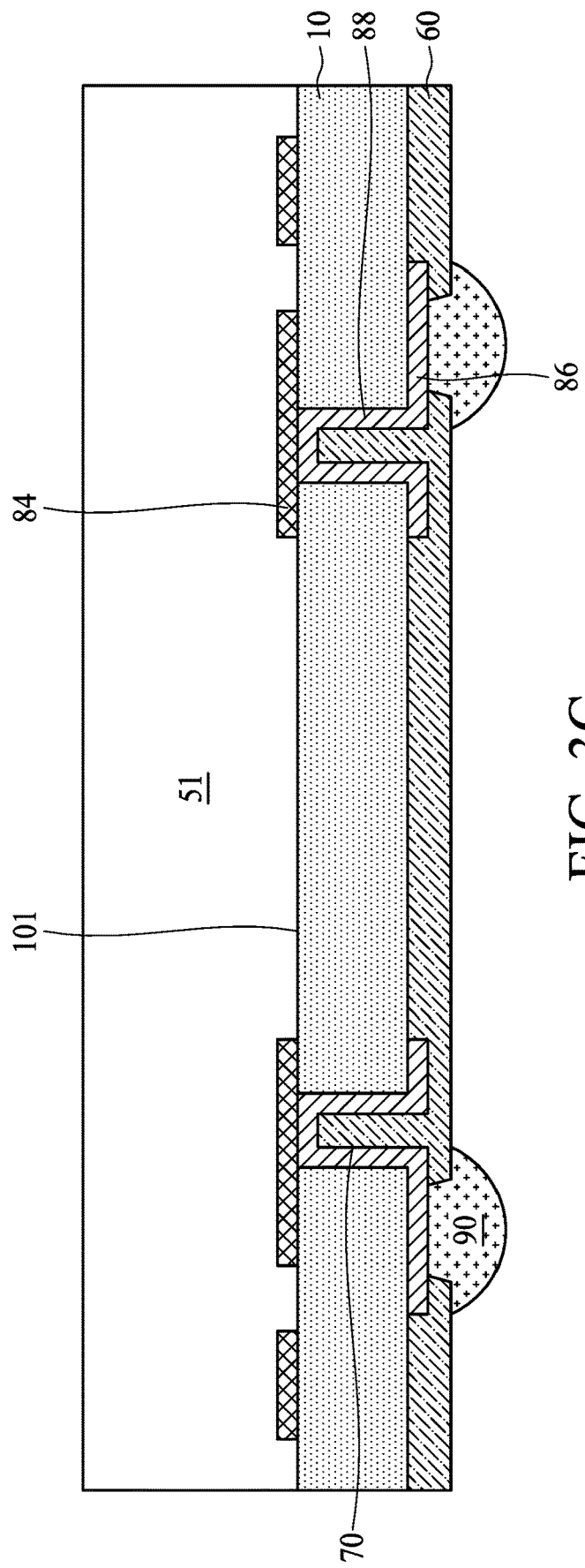

Referring to FIG. 3C, interconnection structures (e.g., conductive posts) 88 are formed in the openings 70. Each of the interconnection structures 88 defines an opening. The interconnection structures 88 include copper or other suitable metals or alloys. A conductive pattern 86 is formed on the surface 102 of the substrate 10 and contacts the interconnection structures 88. In some embodiments, the conductive pattern 86 includes copper or other suitable metals or alloys. Next, a protection layer 60 is formed on the surface 102 of the substrate 10 to cover a portion of the conductive pattern 86 and the interconnection structure 88. A portion of the protection layer 60 is filled in the opening defined by the interconnection structures 88. A conductive bump 90 is formed on the protection layer 60 and contacts the conductive pattern 86.

Figure 3D:
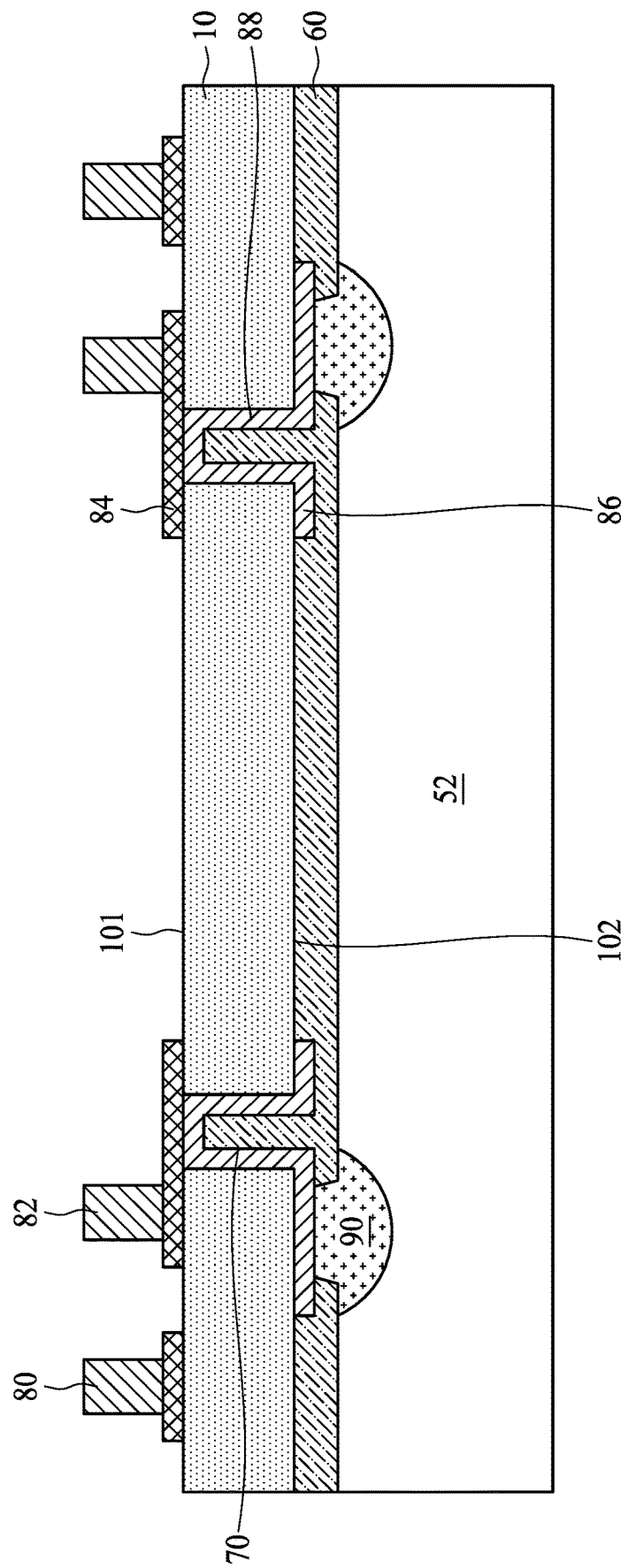

Referring to FIG. 3D, a carrier 52 is attached to the protection layer 60 and the carrier 51 is removed from the substrate 10. A sealing structure 80 and one or more interconnection structures 82 are formed on the conductive pattern 84. In some embodiments, the sealing structure 80 and the interconnection structure are formed by a single process. Alternatively, they can be formed by different processes. In some embodiments, the sealing structure 80 and interconnection structures 82 may include a plurality of conductive layers.

Figure 3E:
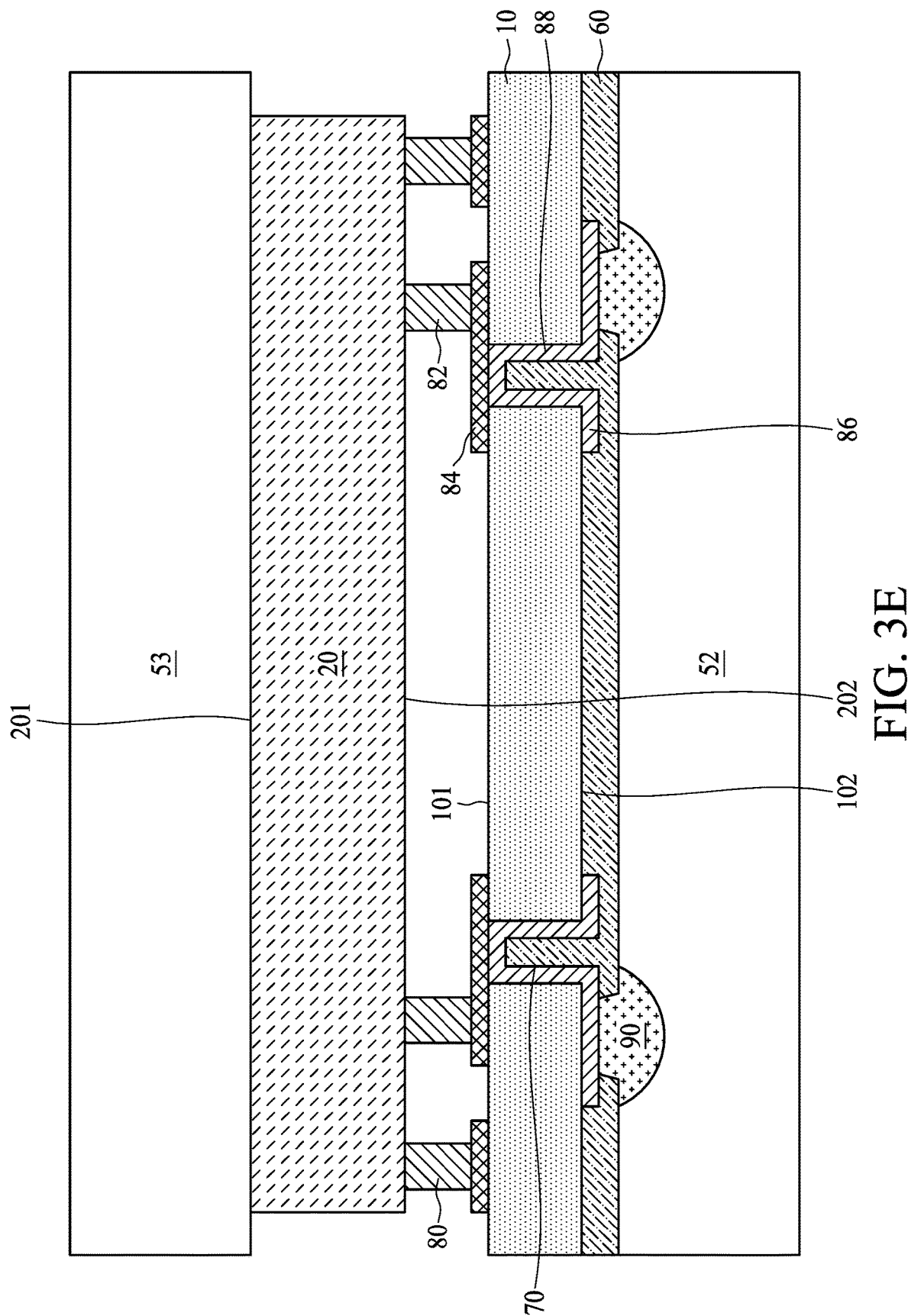

Referring to FIG. 3E, a microelectromechanical device 20 with a backside surface attached to the carrier 53 is disposed on the sealing structure 80 and interconnection structures 82. The active surface of the microelectromechanical device 20 is electrically connected to the interconnection structures 82.

Figure 3F:
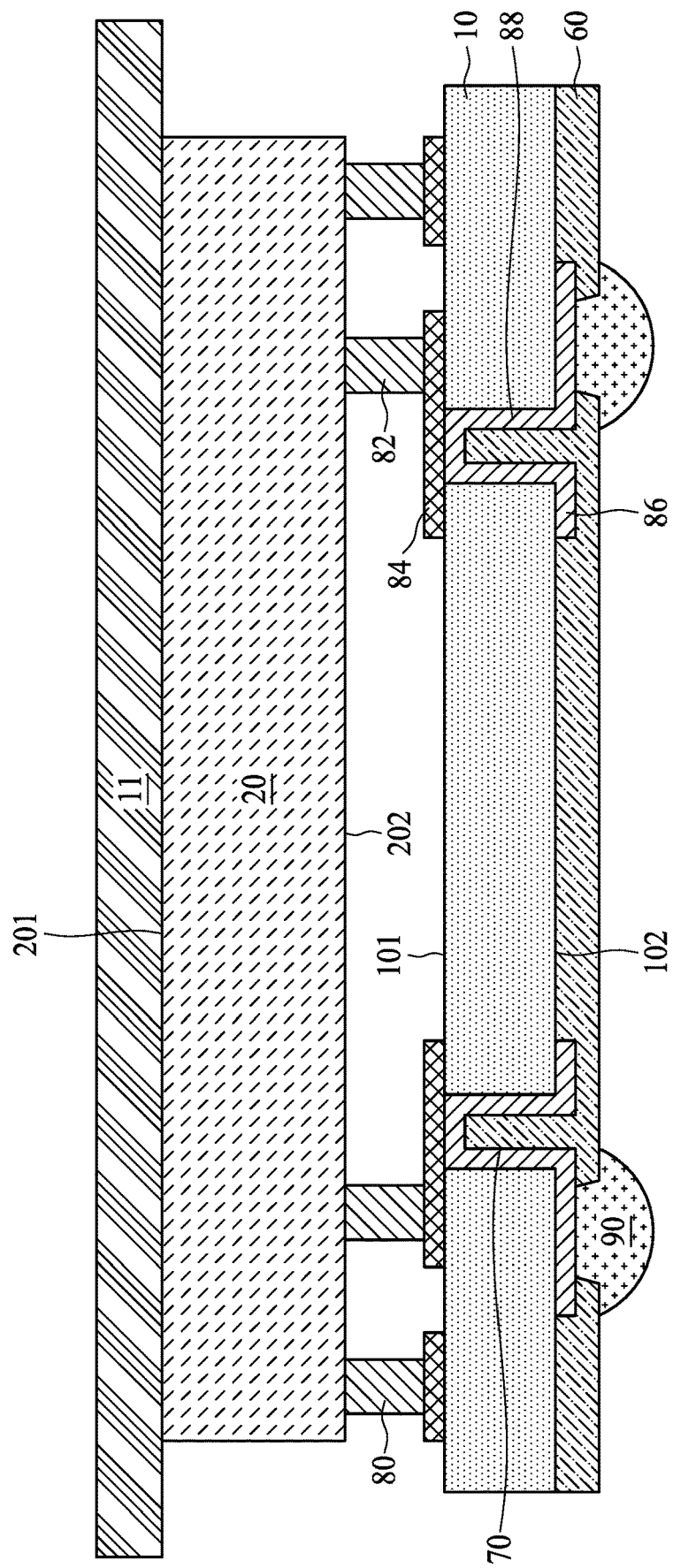

Referring to FIG. 3F, the carriers 53 and 52 are removed to formed the semiconductor package 1 as shown in FIG. 1. In some embodiments, the microelectromechanical device 20 may be connected to a wafer through an adhesive 11. Then, a singulation operation may be performed.

Figure 4C:
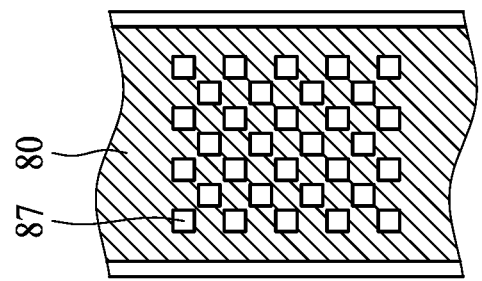
FIG. 4B and FIG. 4C illustrate enlarged views of a sealing structure of FIG. 4A in accordance with some embodiments of the present disclosure.
Figure 4B:
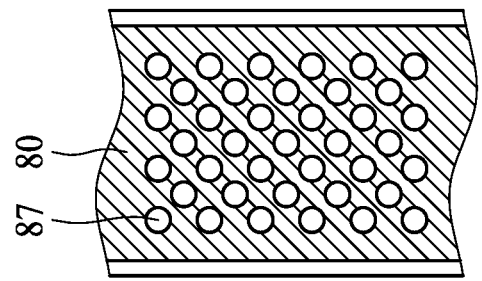
Figure 4A:
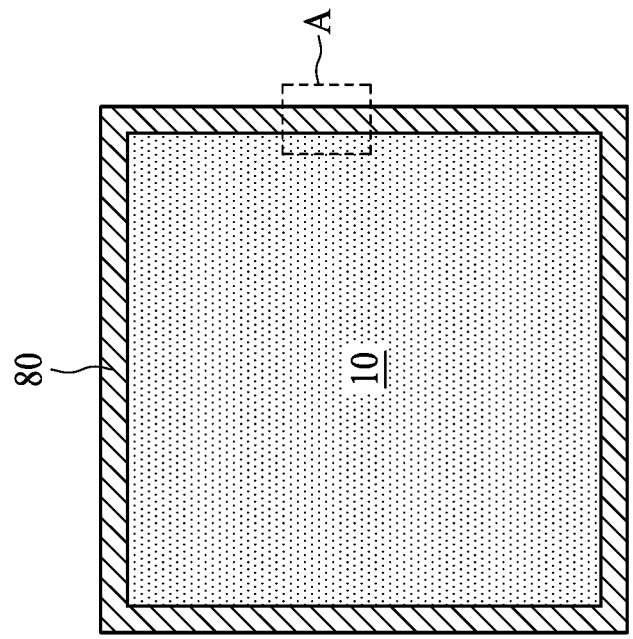
FIG. 4A illustrates a top view of the semiconductor package of FIG. 1 in accordance with some embodiments of the present disclosure.

FIG. 4A illustrates a top view of the semiconductor package 1 of FIG. 1 in accordance with some embodiments of the present disclosure. For the clarity, the interconnection structures 82 and the microelectromechanical device 20 are not illustrated. As shown in FIG. 4A, the sealing structure 80 is disposed along the edges of the substrate 10.

FIGS. 4B and 4C illustrate enlarged views of a portion of the sealing structure 80 outlined by a dotted-line rectangle A in accordance with some embodiments of the present disclosure. As shown in FIGS. 4B and 4C, the sealing structure 80 may include a plurality of openings or holes 87, which can help to avoid a solder material (e.g., included in the bonding element 95 shown in FIG. 2) from bleeding out during the manufacturing process. In some embodiments, the openings or holes may be circular (as shown in FIG. 4B), square (as shown in FIG. 4C), rectangular or other suitable shapes. During the bonding operation, the material of the bonding element 95 is melted and applied between the sealing structures 80a and 80b for connecting the sealing structures 80a and 80b. The melted bonding element 95 may be filled in the plurality of openings or holes 87 of the sealing structures 80a and 80b.

The plurality of openings or holes 87 arranged in a high density may define a plurality of accommodation spaces to accommodate the melted bonding element 95. The bleeding out of the solder material (bonding element 95) may be avoided, at least in part, due to the accommodation spaces of the openings or holes 87.

Figure 5A:
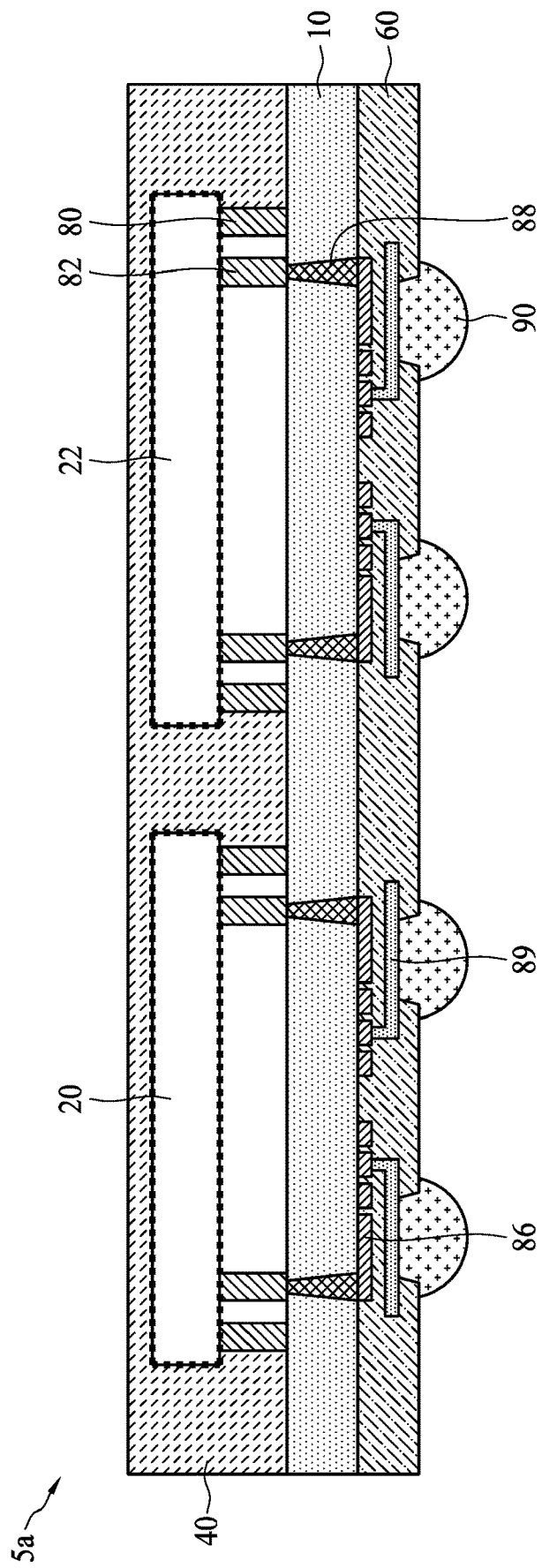
FIG. 5A illustrates a semiconductor package in accordance with some embodiments of the present disclosure.

FIG. 5A illustrates a semiconductor package 5a in accordance with some embodiments of the present disclosure. The semiconductor package 5a is similar to that of FIG. 1, and certain differences therebetween will be described below.

The semiconductor package 5a includes an encapsulation structure 40 encapsulating the substrate 10, sealing structure 80 and microelectromechanical devices 20 and 22. In some embodiments, a material of the encapsulation structure 40 may include, for example, a solder mask, a PP, a PI, an epoxy, a molding compound, or other suitable conductive materials. In addition, the interconnection structure 88 of the semiconductor package 5a does not define an opening (e.g., is a monolithic pillar). In some embodiments, the semiconductor package 5a includes another microelectromechanical device 22 similar to the microelectromechanical device 20. The semiconductor package 5a omits the conductive pattern 84. Conductive patterns 89 are formed in the protection layer 60 and contact the conductive pattern 86. The conductive bump 90 contacts the conductive pattern 89. In some embodiments, the conductive patterns 89 include copper or other suitable metals or alloys.

Figure 5B:
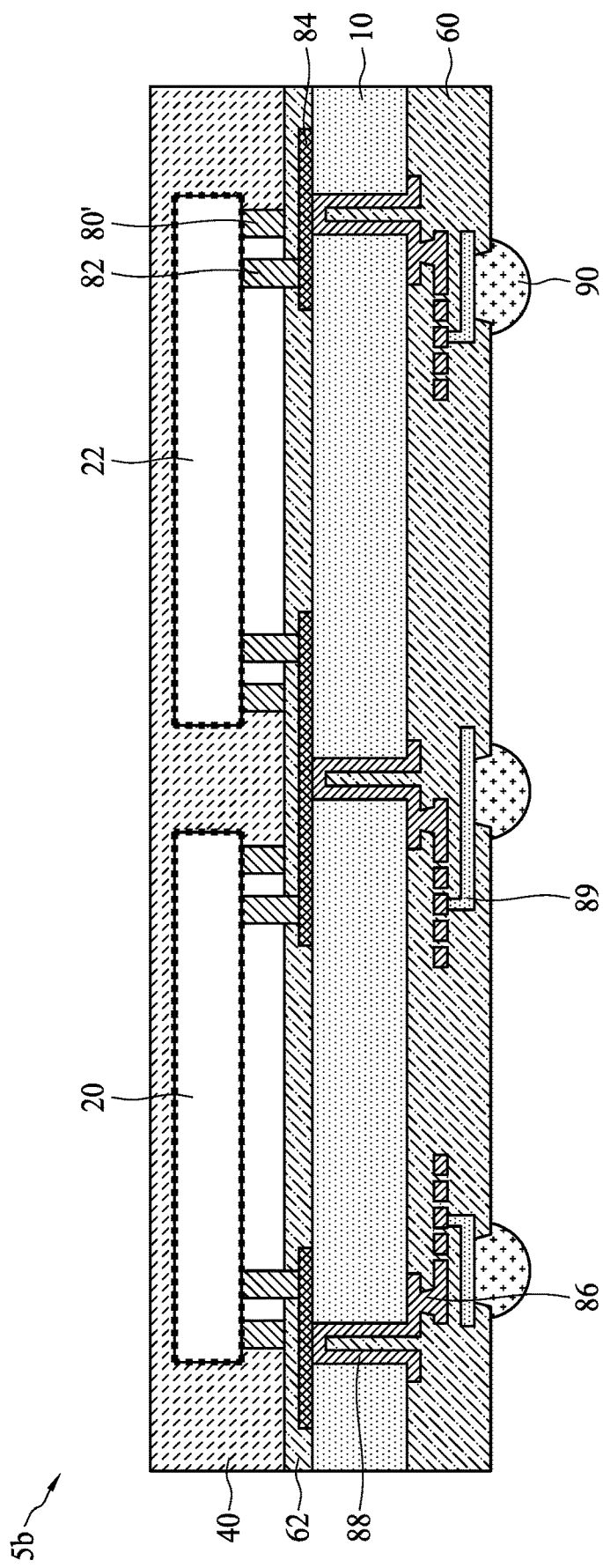
FIG. 5B illustrates a semiconductor package in accordance with some embodiments of the present disclosure.

FIG. 5B illustrates a semiconductor package 5b in accordance with some embodiments of the present disclosure. The semiconductor package 5b is similar to that of FIG. 5A, and certain differences therebetween will be described below.

The semiconductor package 5b includes a protection layer 62 disposed on the surface 101 of the substrate 10. The protection layer 62 may cover a first portion of the conductive pattern 84 and expose a second portion of the conductive pattern 84 for electrical connections. In one or more embodiments, the protection layer 62 includes a PI, a polymer, a resin or other suitable materials. The encapsulation structure 40 is disposed on the protection layer 62. The conductive pattern 84 is electrically connected to the interconnection structures 82. In some embodiments, a sealing structure 80' is disposed on the protection layer 62. The sealing structure 80' may include a polymer, an insulation material or other suitable materials.

Figure 5C:
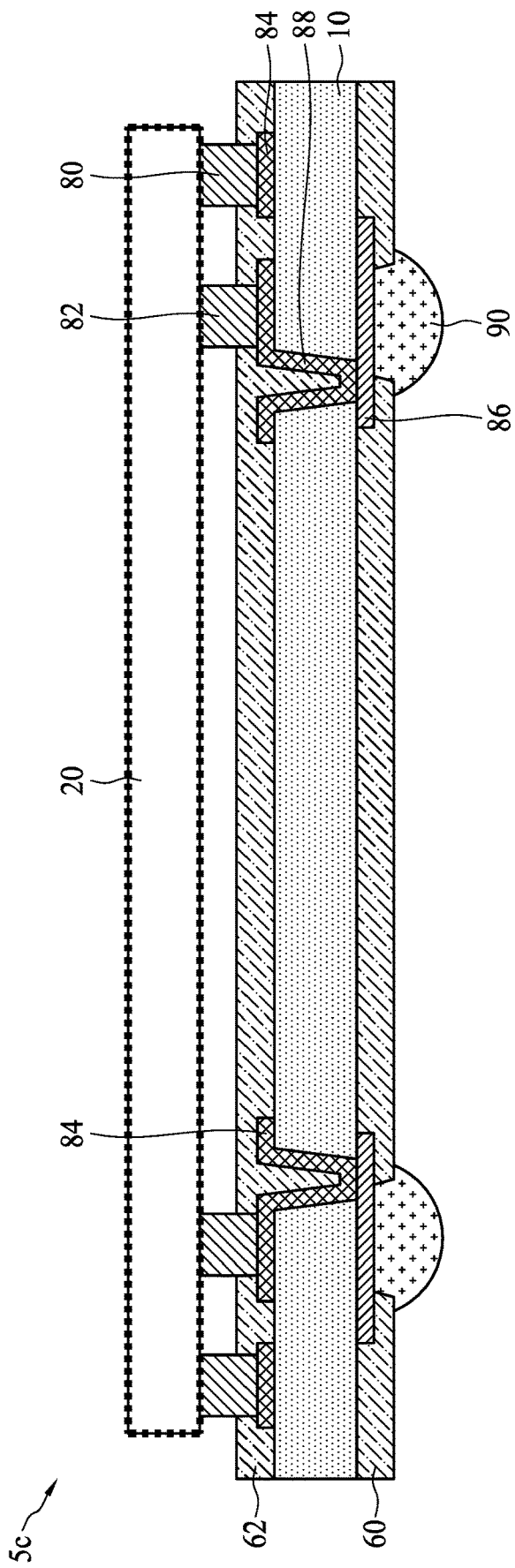
FIG. 5C illustrates a semiconductor package in accordance with some embodiments of the present disclosure.

FIG. 5C illustrates a semiconductor package 5c in accordance with some embodiments of the present disclosure. The semiconductor package 5c is similar to that of FIG. 1, and certain differences therebetween will described below.

The semiconductor package 5c includes a protection layer 62 disposed on the surface 101 of the substrate 10. The protection layer 62 may cover a first portion of the conductive pattern 84 and expose a second portion of the conductive pattern 84 for electrical connections. The interconnection structure 88 defines an opening. A portion of the passivation layer 62 is filled in the opening defined by the interconnection structures 88. The interconnection structures 88 contact the conductive patterns 84 and 86.

Figure 6:
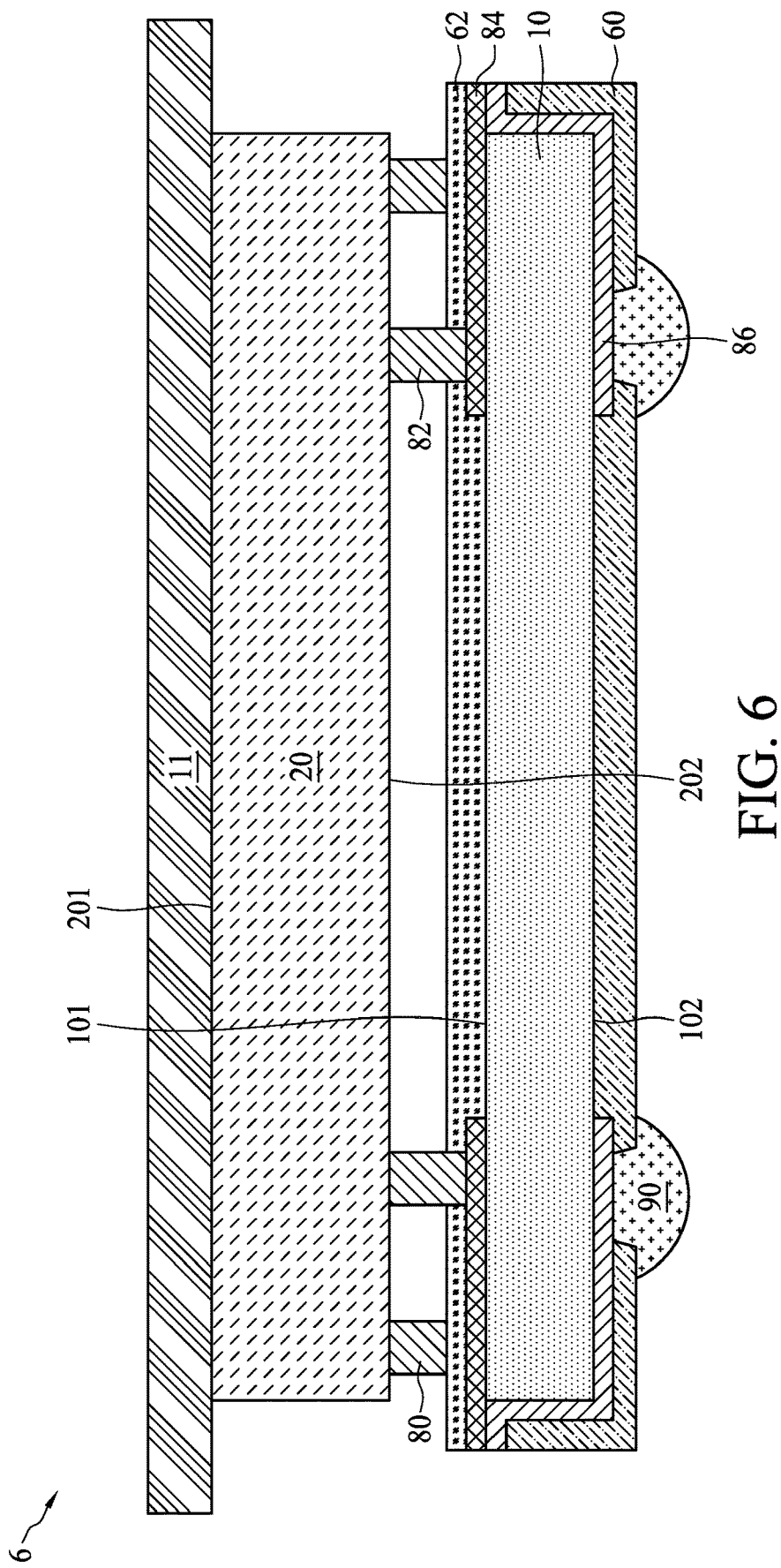
FIG. 6 illustrates a semiconductor package in accordance with some embodiments of the present disclosure.

FIG. 6 illustrates a semiconductor package 6 in accordance with some embodiments of the present disclosure. The semiconductor package 6 is similar to that of FIG. 1, and certain differences therebetween will be described below.

The semiconductor package 6 includes a protection layer 62 disposed on the surface 101 of the substrate 10. The protection layer 62 may cover a first portion of the conductive pattern 84 and expose a second portion of the conductive pattern 84 for electrical connections. The semiconductor package 6 includes an adhesive 11 (e.g., a dicing tape) on the microelectromechanical device 20. The microelectromechanical device 20 is connected to the substrate 10 through the conductive pattern 86 extending along sidewalls of the substrate 10 to connect to the conductive pattern 84. The sealing structure 80 is disposed on the protection layer 62.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" or "about" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It can be clearly understood by those skilled in the art that various changes may be made, and equivalent elements may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A semiconductor package, comprising:
   a substrate;
   a microelectromechanical device disposed on the substrate;
   an interconnection structure connecting the substrate to the microelectromechanical device; and
   a metallic sealing structure surrounding the interconnection structure, wherein the substrate has a surface facing toward the microelectromechanical device and the microelectromechanical device has a surface facing towards the substrate, and the metallic sealing structure comprises:
      a first sealing structure disposed on the surface of the substrate; and
      a second sealing structure disposed on a surface of the microelectromechanical device,
      wherein the first sealing structure and the second sealing structure are connected to each other.

2. The semiconductor package of claim 1, wherein the substrate includes a silicon material.

3. The semiconductor package of claim 2, wherein the substrate includes a through silicon via (TSV) penetrating the substrate.

4. The semiconductor package of claim 3, wherein the substrate has a first surface facing toward the microelectromechanical device and a second surface opposite to the first surface, and the semiconductor package further comprises:
   a first conductive pattern disposed on the first surface of the substrate; and
   a second conductive pattern disposed on the second surface of the substrate,
   wherein the first conductive pattern is electrically connected to the interconnection structure.

5. The semiconductor package of claim 1, wherein the substrate includes a glass material.

6. The semiconductor package of claim 5, wherein the substrate includes a through glass via (TGV) penetrating the substrate.

7. The semiconductor package of claim 6, wherein the substrate has a first surface facing toward the microelectromechanical device and a second surface opposite to the first surface, and the semiconductor package further comprises:
   a first conductive pattern disposed on the first surface of the substrate; and
   a second conductive pattern disposed on the second surface of the substrate,
   wherein the first conductive pattern is electrically connected to the interconnection structure.

8. The semiconductor package of claim 1, wherein the first sealing structure includes a plurality of conductive layers.

9. The semiconductor package of claim 1, wherein the second sealing structure includes a plurality of conductive layers.

10. The semiconductor package of claim 1, wherein the first and second sealing structures include gold or tin.

11. The semiconductor package of claim 1, further comprising bonding elements, and wherein the metallic sealing structure defines a plurality of holes filled with the bonding elements.

12. A semiconductor package, comprising:
    a substrate having a first surface and a second surface opposite to the first surface, defining an opening, and comprising a conductive post disposed in the opening;
    a microelectromechanical device disposed on the substrate;

an interconnection structure disposed between the substrate and the microelectromechanical device;
a sealing structure disposed between the substrate and the microelectromechanical device;
a first conductive pattern disposed on the first surface of the substrate and facing toward the microelectromechanical device; and
a second conductive pattern disposed on the second surface of the substrate,
wherein the first conductive pattern is electrically connected to the second conductive pattern through the conductive post, and
the interconnection structure is surrounded by the sealing structure.

13. The semiconductor package of claim 12, wherein the sealing structure includes an insulation material.

14. The semiconductor package of claim 12, wherein the interconnection structure is electrically connected to the first conductive pattern.

15. The semiconductor package of claim 12, wherein the substrate includes a silicon material.

16. The semiconductor package of claim 12, wherein the substrate includes a glass material.

17. The semiconductor package of claim 12, further comprising bonding elements, wherein the sealing structure defines a plurality of holes filled with the bonding elements.

18. The semiconductor package of claim 12, wherein the microelectromechanical device has a surface facing towards the substrate, and wherein the sealing structure comprises:
a first sealing structure disposed on the first surface of the substrate; and
a second sealing structure disposed on the surface of the microelectromechanical device,
wherein the first sealing structure and the second sealing structure are connected to each other.

19. The semiconductor package of claim 18, wherein the first sealing structure or the second sealing structure includes a plurality of conductive layers.

* * * * *